United States Patent
Ott

(10) Patent No.: US 9,763,344 B2
(45) Date of Patent: Sep. 12, 2017

(54) ELECTRONIC MODULE FOR A CONTROL UNIT

(75) Inventor: Harald Ott, Freiberg am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/352,436

(22) PCT Filed: Sep. 4, 2012

(86) PCT No.: PCT/EP2012/067165
§ 371 (c)(1),
(2), (4) Date: Aug. 6, 2014

(87) PCT Pub. No.: WO2013/068146
PCT Pub. Date: May 16, 2013

(65) Prior Publication Data
US 2015/0022976 A1    Jan. 22, 2015

(30) Foreign Application Priority Data

Nov. 8, 2011   (DE) .................. 10 2011 085 918
Aug. 6, 2012   (DE) .................. 10 2012 213 916

(51) Int. Cl.
*H05K 5/00* (2006.01)
*H01L 23/057* (2006.01)
(Continued)

(52) U.S. Cl.
CPC ......... *H05K 5/0082* (2013.01); *H01L 23/057* (2013.01); *H01L 23/10* (2013.01);
(Continued)

(58) Field of Classification Search
CPC ............................. H05K 7/20; H05K 1/0207
See application file for complete search history.

(56) References Cited

U.S. PATENT DOCUMENTS 5,233,873 A * 8/1993 Mozgowiec ............ G01P 1/023
73/493
5,608,611 A * 3/1997 Szudarek ............ B60R 16/0239
174/138 G (Continued)

FOREIGN PATENT DOCUMENTS

CN          101107893 A     1/2008
DE    10 2005 002 813 A1    8/2006

OTHER PUBLICATIONS

International Search Report corresponding to PCT Application No. PCT/EP2012/067165, mailed Jan. 10, 2013 (German and English language document) (5 pages).

*Primary Examiner* — Xanthia C Cunningham
(74) *Attorney, Agent, or Firm* — Maginot, Moore & Beck LLP

(57) ABSTRACT

An electronic module for a vehicle includes a covering element, a component-carrier printed circuit board element, a carrier element having a first side and a second side, a printed circuit board element, and at least one contact-connection element. The contact-connection element is configured to provide a conductive contact-connection between the component-carrier printed circuit board element and the printed circuit board element. The covering element and component-carrier printed circuit board element are positioned on the first side of the carrier element, and the printed circuit board element is positioned on the second side of the carrier element. The carrier element has at least one opening, and the contact-connection element is led through the opening.

17 Claims, 7 Drawing Sheets

(51) Int. Cl.
*H01L 23/10* (2006.01)
*H05K 1/02* (2006.01)
*H05K 5/06* (2006.01)
*H05K 1/14* (2006.01)
*H05K 3/36* (2006.01)

(52) U.S. Cl.
CPC ........... *H05K 1/0271* (2013.01); *H05K 5/003* (2013.01); *H05K 5/06* (2013.01); *H01L 2224/48227* (2013.01); *H01L 2224/48245* (2013.01); *H01L 2224/48247* (2013.01); *H01L 2224/49175* (2013.01); *H01L 2924/16152* (2013.01); *H05K 1/14* (2013.01); *H05K 3/368* (2013.01); *H05K 2201/10151* (2013.01); *H05K 2203/049* (2013.01)

(56) References Cited

U.S. PATENT DOCUMENTS

| | | | | |
|---|---|---|---|---|
| 6,430,054 B1* | 8/2002 | Iwata | ............... | H05K 7/026 174/560 |
| 6,570,773 B1* | 5/2003 | Loibl | ............... | B60R 16/0239 361/748 |
| 6,597,578 B2* | 7/2003 | Shiina | ............... | B60R 16/0238 361/628 |
| 6,605,779 B2* | 8/2003 | Takata | ............... | H01L 23/3135 174/559 |
| 6,751,858 B2* | 6/2004 | Tokuhara | ............... | G01L 19/0627 29/595 |
| 6,943,292 B2* | 9/2005 | Dingman | ............... | H05K 7/142 174/535 |
| 6,984,133 B2* | 1/2006 | Naitou | ............... | H05K 1/144 439/76.2 |
| 7,011,554 B2* | 3/2006 | Taniguchi | ............... | H01R 4/64 439/760 |
| 7,075,112 B2* | 7/2006 | Roberts | ............... | G02B 3/0056 257/79 |
| 7,078,620 B2* | 7/2006 | Ikeda | ............... | B60R 11/02 174/50 |
| 7,193,852 B2* | 3/2007 | Wetzel | ............... | B60R 16/0239 257/726 |
| 7,284,435 B2* | 10/2007 | Ueno | ............... | G01L 19/0654 73/706 |
| 7,482,989 B2* | 1/2009 | Nakagawa | ............... | H01Q 1/1271 343/711 |
| 7,755,907 B2* | 7/2010 | Inagaki | ............... | B60R 16/0239 174/50.5 |
| 7,808,784 B2* | 10/2010 | Graf | ............... | B60K 15/03 165/104.33 |
| 7,983,054 B2* | 7/2011 | Eglinger | ............... | B60R 16/0239 174/250 |
| 8,792,242 B2* | 7/2014 | Wetzel | ............... | H05K 5/0082 361/707 |
| 8,817,482 B2* | 8/2014 | Onishi | ............... | H01Q 1/1271 361/726 |
| 2001/0015887 A1* | 8/2001 | Sanada | ............... | H05K 1/144 361/704 |
| 2004/0212965 A1* | 10/2004 | Ishii | ............... | H01L 23/473 361/709 |
| 2005/0145414 A1* | 7/2005 | Tohkairin | ............... | H05K 1/0207 174/252 |
| 2005/0285806 A1* | 12/2005 | Ikeda | ............... | H01Q 9/0407 343/713 |
| 2007/0107932 A1 | 5/2007 | Jauniskis et al. | | |
| 2007/0284719 A1* | 12/2007 | Shiota | ............... | H01L 23/24 257/687 |
| 2008/0019106 A1* | 1/2008 | Wetzel | ............... | F16H 61/0006 361/752 |
| 2008/0108478 A1* | 5/2008 | Wetzel | ............... | B60R 16/0239 477/36 |
| 2008/0160246 A1* | 7/2008 | Buhler | ............... | H01L 23/3735 428/99 |
| 2009/0186446 A1 | 7/2009 | Kwon et al. | | |
| 2010/0165601 A1* | 7/2010 | Yoon | ............... | G02F 1/133603 362/97.1 |
| 2010/0288525 A1 | 11/2010 | Basavanhally et al. | | |
| 2010/0328913 A1* | 12/2010 | Kugler | ............... | H01L 24/18 361/761 |
| 2011/0028268 A1* | 2/2011 | Kang | ............... | B60K 6/48 477/3 |
| 2011/0088936 A1* | 4/2011 | Schaaf | ............... | H01L 23/3677 174/260 |
| 2011/0180917 A1 | 7/2011 | Tankg | | |
| 2013/0010444 A1* | 1/2013 | Wu | ............... | H05K 3/284 361/764 |
| 2013/0182397 A1* | 7/2013 | Abe | ............... | H05K 3/4629 361/748 |

* cited by examiner

Section B-B

Section A-A

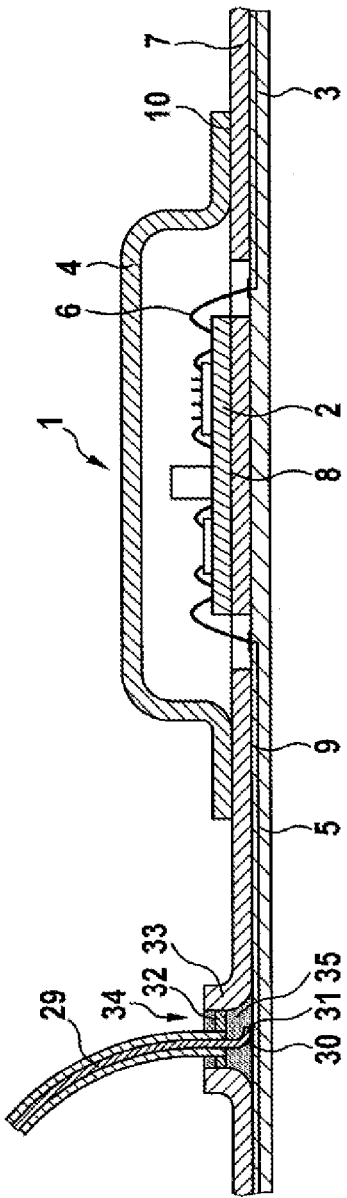
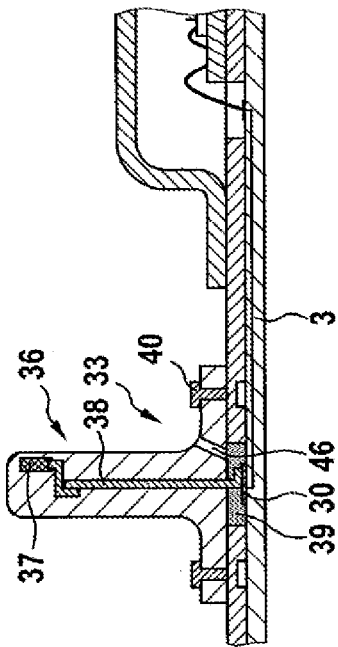
Fig. 3a
Fig. 3b

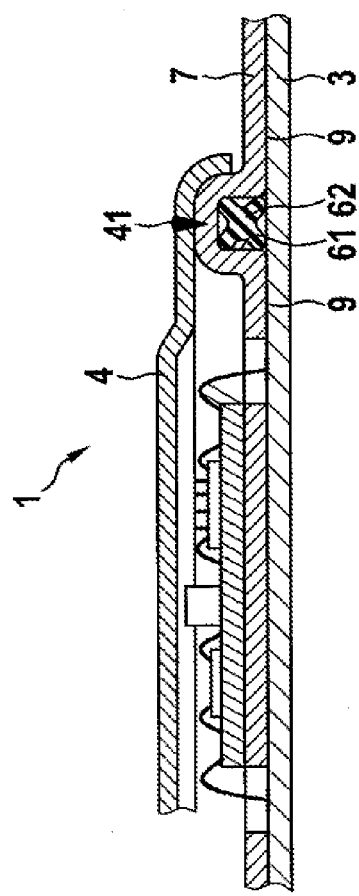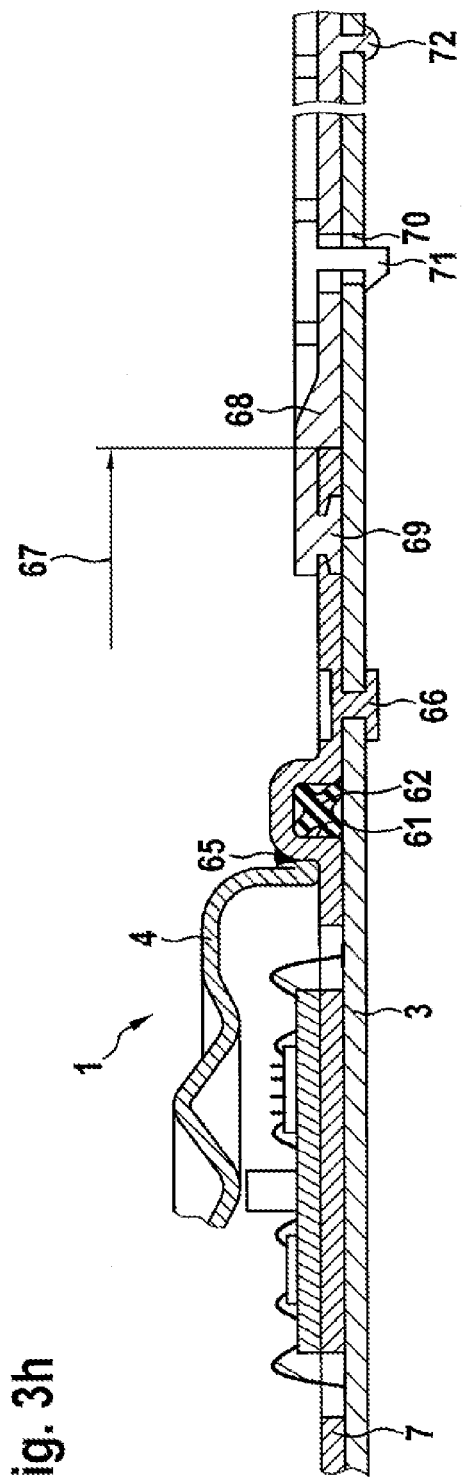
Fig. 3g
Fig. 3h

ELECTRONIC MODULE FOR A CONTROL UNIT

This application is a 35 U.S.C. §371 National Stage Application of PCT/EP2012/067165, filed on Sep. 4, 2012, which claims the benefit of priority to Serial No. DE 10 2011 085 918.7 and DE10 2012 213 916.8, filed on Nov. 8, 2011 and Aug. 6, 2012 in Germany, the disclosures of which are incorporated herein by reference in their entirety.

The present disclosure relates to electronic modules for vehicle control units. The present disclosure particularly relates to a novel design for an electronic module for a control unit of a vehicle. The present disclosure further particularly relates to an electronic module, to a control unit and also to a vehicle.

BACKGROUND

Conventional electronic modules for control units, for example known electronic modules for transmission control units, are usually designed as hermetically sealed modules. Said modules have, for example, a metal housing through which contact pins are routed to the outside. In this case, the contact pins are sealed by glass sealing. Advanced electrical connection technology to form individual functional elements in the module, for example to form sensors, internal and external plugs, is usually realized with so-called stamped grids which can be partially encapsulated in plastic, or else, for example, is designed with cable connections in the case of remote functional elements.

A further design of electronic modules is shown according to FIG. 1a. In this case, the electronic module 1 is again designed in a hermetically sealed manner and has a covering element 4 and also a support element 7. A component support printed circuit board element 2, which is coupled to further printed circuit board elements 3 using contact-making elements 6, is interposed between covering element 4 and support element 7 in a region 24 inside the covering element 4. Said further printed circuit board elements, for their part, are arranged and designed in such a way as to provide a connection between the region 24 inside the covering element 4 and the region 26 outside the covering element 4.

According to FIG. 1a, the result is therefore a basic layer structure of a support element 7 and a printed circuit board element 3 which is mounted on said support element and is closed off by a covering element 4.

Support element 7 can be designed, by way of example, as a metal plate, for example an aluminum plate with a sheet thickness of from 3 to 4 mm. Component support printed circuit board element 2, by way of example in the form of a low temperature cofired ceramic (LTCC) or micro printed circuit board, is mounted on said support element, for example adhesively bonded using a thermally conductive adhesive 8.

Printed circuit board element 3, which is provided with a cutout 15, is likewise mounted on the support element 7, for example adhesively bonded over a wide area in an oil-tight manner using an adhesive 9, a liquid adhesive agent or an adhesive strip. In this case, printed circuit board element 3 realizes the electrical connection between the electronic components on component support printed circuit board element 2 and the external functional elements, such as plugs, sensors etc. of the electronic module 1 for example.

Covering element 4 is provided and fastened on the printed circuit board element 3 by a sealing adhesive connection 10 in order to protect the electrical components of the component support printed circuit board element 2 and the contact-making elements 6, for example bonds, against external influences such as transmission oil, metal chips and other conductive debris for example.

Owing to different degrees 12, 13, 14 of thermal expansion of printed circuit board element 3, covering element 4 and adhesive connection 10, the adhesive connection 10 is subjected to shearing stress, but this can lead to failure of the adhesive connection. As a result, it is possible for leaks to occur, in particular the hermetic sealing of the inside region 24 can fail.

An internal excess pressure 16 of, for example, 0.5 bar can be produced by temperature swings of, by way of example, $-40°$ C. to $+150°$ C. This can also subject the sealing adhesive connection 10, in particular, to tensile loading. If the covering element 4 deforms, even slightly, further owing to the increase in pressure, the adhesive connection 10 may additionally further be subject to peeling.

As shown in FIG. 1b, there is likewise a relatively large active pressure area 17 which additionally subjects the adhesive connection 9 between printed circuit board element 3 and support element 7 to loading by a force 18.

SUMMARY

One aspect of the present disclosure can therefore be considered that of providing an improved electronic module design for a control unit.

Accordingly, an electronic module for a vehicle, a control unit for a vehicle, and also a vehicle are provided. Preferred refinements can be found in the claims.

According to the disclosure, the sequence of the individual elements of the electronic module, in particular the individual elements of the housing wall of the electronic module, together with the covering element, support element and printed circuit board element, is varied in such a way that a preferred refinement of the electronic module as compared with the electronic module described in FIG. 1a is produced.

For example, the order of support element and also printed circuit board element are initially exchanged in relation to the covering element. In other words, the covering element is situated on the support element and no longer on the printed circuit board element, as illustrated in FIG. 1a. The printed circuit board element is then arranged on the support element. This now results initially in a refinement of the electronic module according to the disclosure which is optimized in this respect since there is now material contact between the covering element and the support element.

In the case of an assumed design of covering element and support element from a similar or the same material, but at least from a material with a similar or comparable coefficient of thermal expansion, initially occurring tensile, shear or shearing forces which can act on an adhesive connection between the covering element and the support element can be reduced or avoided.

The printed circuit board element can then be mounted on the support element over a large area. On account of being mounted over a large area in this way, loading which occurs is less influential on account of different coefficients of thermal expansion between support element and printed circuit board element.

Since the printed circuit board element is further supposed to provide the function of connecting electrical components which are located in the electronic module to the outside, it is necessary to link components of the component support printed circuit board element in the region inside the covering element or in the interior of the electronic module to the printed circuit board element. To this end, a suitable opening is made in the support element, said opening allowing the printed circuit board element to make contact with the components.

In the context of the present disclosure, a printed circuit board element is generally to be understood to mean a signal and/or current distributing component. This therefore includes both conventionally known printed circuit boards (PCB), for example comprising an epoxy resin, and also likewise flexible circuit boards (FCB).

BRIEF DESCRIPTION OF THE DRAWINGS

Embodiments of the disclosure are illustrated in the drawings and explained in greater detail in the following description.

In the drawings

FIGS. 3a to h show further exemplary details of the electronic module according to the disclosure.

DETAILED DESCRIPTION

Figure 1A:
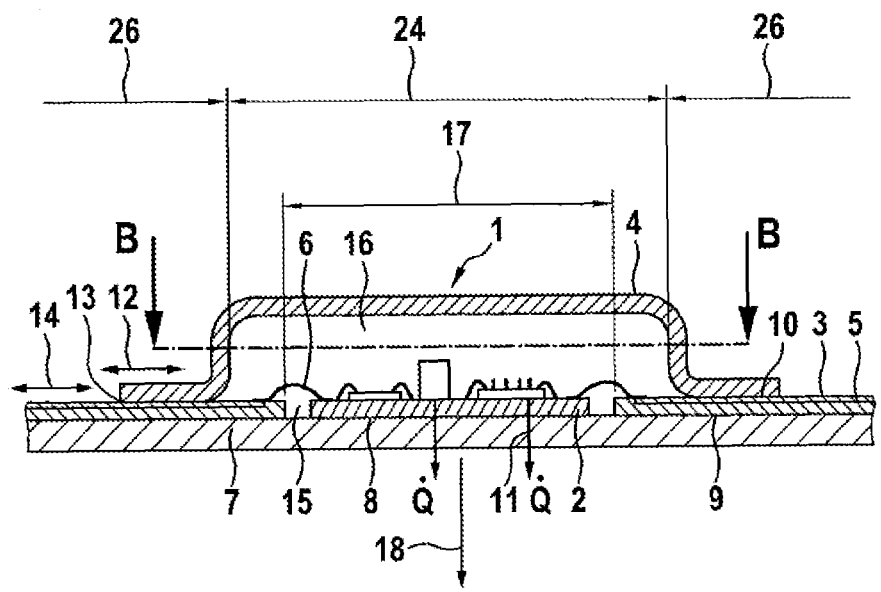
FIG. 1a, b show a design of an electronic module.
Figure 1B:
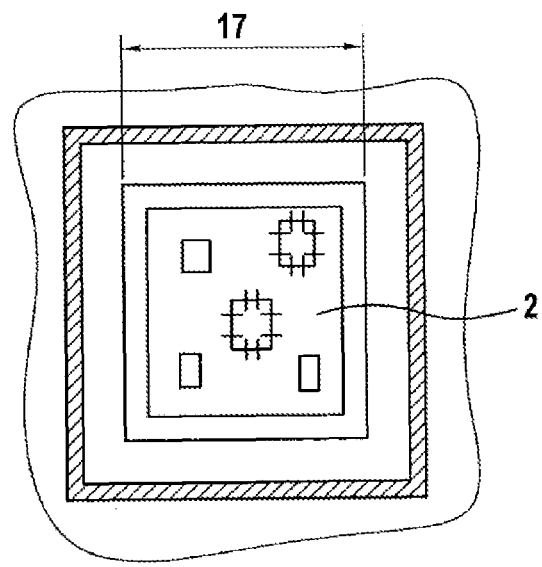
Figure 2A:
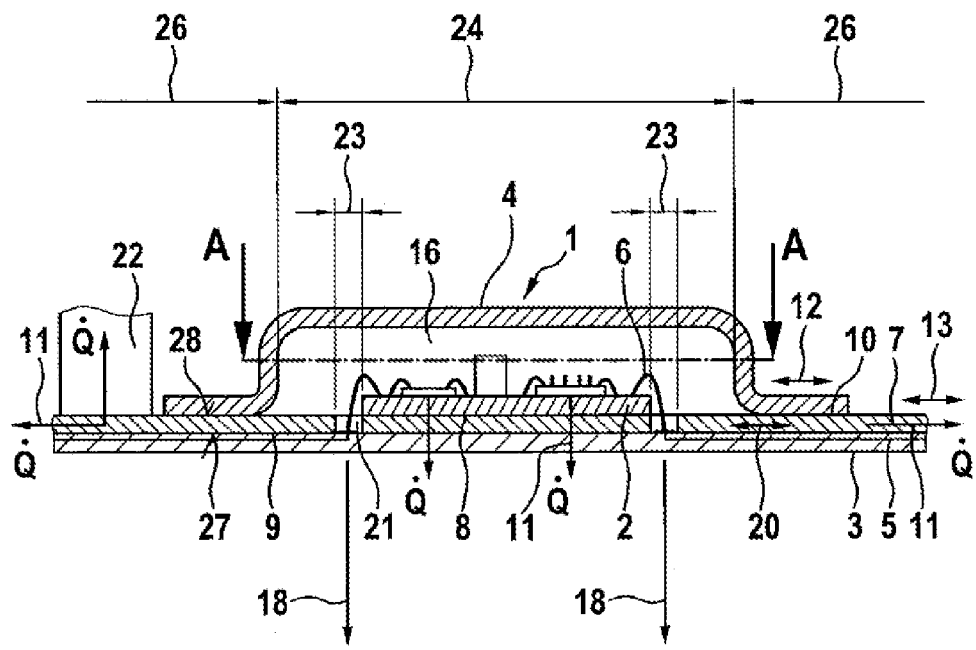
FIG. 2a, b show an exemplary design of an electronic module according to the present disclosure.

FIG. 2a, b show an exemplary design of an electronic module according to the present disclosure.

According to the disclosure, a changed layer structure of the individual components of the electronic module is indicated. Printed circuit board element 3 now bears against one side of the support element 7, whereas covering element 4 is arranged on the opposite side of the support element 7. By way of example, the support plate 7 used can be a metal plate, for example an aluminum sheet with a sheet thickness of 1.5 to 2 mm, possibly reinforced by beads.

Therefore, printed circuit board element 3 can be arranged, by way of example, on a support element bottom side 27, whereas covering element 4 is arranged on a support element top side 28. Printed circuit board element 3 can be mounted on the support element 7 over a wide area in an oil-tight manner using an adhesive 9, for example a liquid adhesive agent or adhesive strip. Similarly, a component support printed circuit board element 2, which is designed, by way of example, as an LTCC or micro printed circuit board which can be adhesively mounted on the support element using a thermally conductive adhesive agent 8, can be arranged on the support element top side 28 in the region 24 inside the covering element 4. As a result, a heat sink 22 can be connected to the component support printed circuit board element 2 using the support element 7, as a result of which lost heat 11 from the electronic components which are arranged on the component support printed circuit board element 2 can be discharged to the sides via the support element 7. Said heat sinks 22 can furthermore also be fastening points of the electronic module according to the disclosure, for example in a control unit housing.

Conductive elements 5, for example copper conductors, can be introduced into the interior of the printed circuit board element 3, said conductive elements making contact with and therefore forming a connection to the components on the component support printed circuit board element 2 with external functional elements, for example plugs or sensors, using a suitable contact-making element 6. Similarly, a connection to a vehicle communication bus, such as a LIN or CAN bus, is feasible.

One to, by way of example, four opening(s) 21, which are designed as elongate holes for example, can be provided in the support element 7 in order to realize a connection of the elements to the component support printed circuit board element 2 to conductive elements 5 which are located in the printed circuit board element 3, for example using contact-making elements 6, for example designed as bonds.

Arranging the individual elements of the electronic module in this way now makes it possible for the covering element 4 and the support element 7 to be manufactured from a comparable material, for example aluminum or steel, and therefore have an identical or at least similar or only slightly differing coefficient 12, 20 of thermal expansion. As a result, secure fastening of the covering element or sealing can be realized by adhesive bonding, in particular without additionally occurring shearing forces which can act on the adhesive connection.

In the electronic module according to the disclosure, the active pressure area 23 is considerably smaller than in conventional electronic modules owing to the structure, and this therefore results in a lower force 18. This in turn has a positive effect on the overall design of the electronic module, in particular the adhesive connection and the leaktightness of the control unit and, respectively, of the electronic module.

Figure 2B:
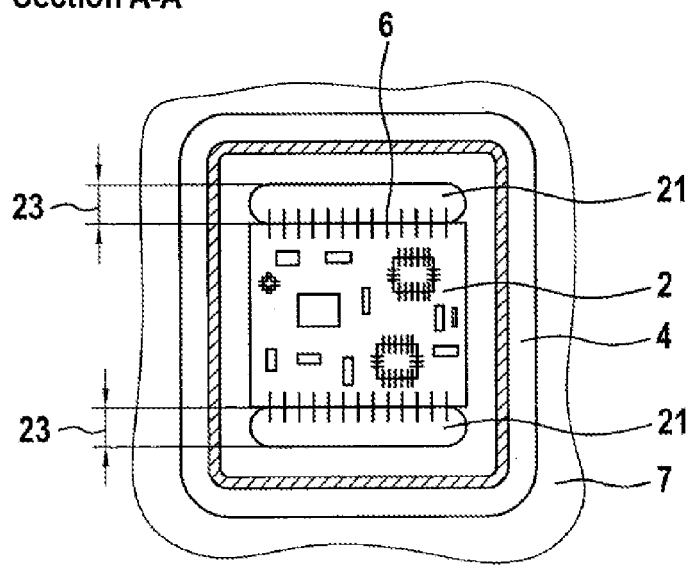

FIG. 2b shows a section of the electronic module 1 through AA.

FIG. 3a shows a design of an electronic module which is comparable to that of FIG. 2a. As a further detail, the support element 7 has a further opening or cutout 33, in particular with an entry point, outside the covering element 4 and therefore in a region 26 outside the covering element 4. In this case, the support element 7 provides access to the printed circuit board element 3 which is situated beneath it, and in particular to conductive elements 5 which are located in said printed circuit board element. Therefore, a printed circuit board element 29 can, for example, be connected to and, respectively, disconnected from the conductive elements 5, which are located in the printed circuit board element 3, by individual cable wires 31. Therefore, a contact-making means for cable 29, for example a solder pad 30, can be arranged on the base of the opening 33.

Before a possible selective soldering process, the cable or the FPC (Flexible Printed Circuit) can be fastened or held in the opening 33 by a plastic holder 32. After the soldering process, an encapsulation compound 35 can be introduced up to a specific level 34 and, after it has cured, serves to protect against chips and/or oil for example.

The electronic module in FIG. 3b is comparable to the electronic module 1 of FIGS. 2a and 3a, with the exception that a sensor element 36 is provided instead of cable 29.

In this case, FIG. 3b shows fastening of a module functional element, by way of example a rotation speed sensor element 36. Said element is shown, in a simplified manner, as ASIC 37 with a stamped grid and conductor tracks 38 which, at the lower end, are connected to the solder pad 30 of the printed circuit board element 3. In order to fasten the sensor element 36, the support element can have pins which, after the sensor element 36 is mounted, are deformed to form a rivet head 40 in order to connect sensor element 36 substantially without play. A curing encapsulation compound 39 or a coating can again be used as chip- or oil-protection means, it being possible for said chip- or oil-protection means to be subsequently introduced through opening 46.

Figure 3C:
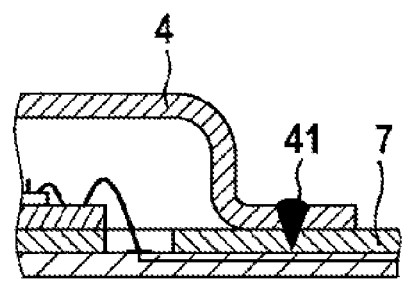
Figure 3D:
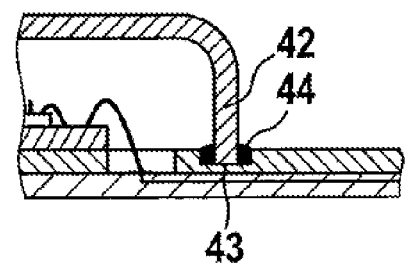
Figure 3E:
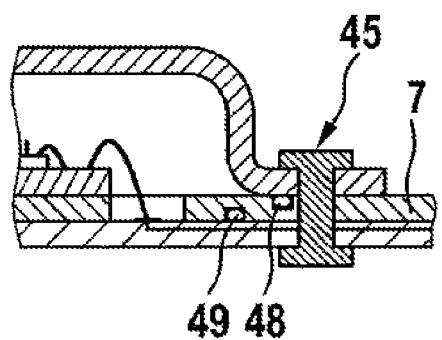

FIGS. 3c to 3e show possible connections of the covering element 4 to the support element 7.

In FIG. 3c, the design of elements of covering element 4 and support element 7 from substantially the same material, for example aluminum or steel, allows secure fastening of the cover and/or sealing by forming a welded connection 41. This welded connection can be realized, by way of example, as a laser, electron beam or resistance welding connection.

FIG. 3d shows the use of an encapsulation compound 44 for sealing and fastening the covering element 4 on the support element 7. In FIG. 3d, the border 42 of the covering element 4 is introduced into a groove 43 which runs in the support element 7, and can then be sealed and fastened with a curing encapsulation compound 44. In this case, encapsulation compound 44 can also have a certain residual flexibility and be formed, for example, from a rubber-like material.

FIG. 3e shows a further possible connection of the covering element 4 using a rivet element 45. To this end, a hole which passes through covering element 4, support element 7 and printed circuit board element 3 can be used in order to insert rivet element 45. A groove with sealing elements 48, 49 can be provided in support element 7 on the bottom side 27 and on the top side 28. In this case, it is possible, for example, to dispense with an adhesive connection for sealing purposes.

Figure 3F:
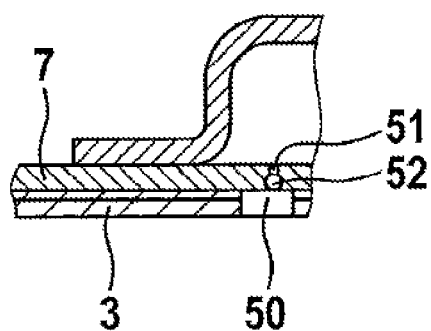
Figure 4:
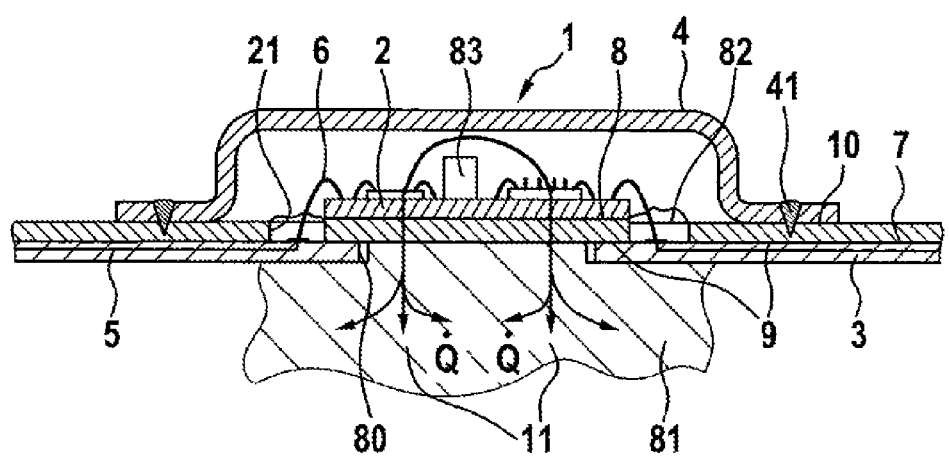
FIG. 4 Shows another exemplary design of an electronic module according to the present disclosure.

FIG. 3f shows an opening, which extends into the region inside the covering element 4, through both printed circuit board element 3 and support element 7. The interior of the covering element can be filled, for example with a silicone gel, through this opening. Similarly, a corresponding opening can be used for a leaktightness check, for example an excess pressure check or a helium leakage test. To this end, a stepped hole 51 can be provided in the support element 7 by way of example, said stepped hole then being closed by a sealing element, for example a spherical element 52 which is introduced from the bottom side or from the side of the printed circuit board element 3 through a hole 50 which is provided in said printed circuit board, and is arrested, for example jammed, in the stepped hole 51.

In FIG. 3g, the support element 7 is designed, by way of example, with a U-shaped, preferably deep-drawn, region 61 which accommodates a sealing element 62, for example a sealing ring, for sealing off the leakage path between support element 7 and printed circuit board element 3. In this case, printed circuit board element 3 can be fastened to the support element 7 by an adhesive fastening 9. A suitable welded connection 41 can again be used, by way of example, to fasten the covering element 4 to the support element 7. A welding method which has a low level of heat input is particularly suitable and preferred, in order to not damage sealing ring 62 or printed circuit board 3.

In the exemplary refinement according to FIG. 3h, the support element 7 again has a U-shaped, deep-drawn region 61 which is provided with a sealing element 62. In this case, the printed circuit board element 3 can be fastened in the region of the electronic module 1 by one or more pins which are formed from the same material as the support element 7 and which can be deformed, after connection, to form a rivet head 66.

In this case, designing the support element 7 from a metal material for heat dissipation is limited to a region 67, for example to the region near the electronic module. The metal design is followed, by way of example, by a molded encapsulation 68 which is formed from a plastic for example and which, as shown in region 69 by way of example, can be connected to the support element 7 by means of a peg form.

In this case, a molded encapsulation 68 makes it possible to combine metal and plastic in one component. In this case, complex shapes which may not have been possible to produce by deep-drawing with sheet metal can be realized in order to accommodate functional elements for example. Furthermore, resilient plastic elements and also a saving in weight in comparison to a metal structure can be realized. The molded encapsulation 68 is also known as the outsert technique.

The printed circuit board element 3 can be fastened, by way of example, by latching hooks 71 and/or by hot-calking pegs 72 in the plastic support element region. To this end, suitable cutouts 70 can be provided in the printed circuit board element 3.

An end joint seam 65, which is in the form of a welded connection by way of example, is used to fasten the covering element 4 to the support element 7 in FIG. 3h.

The individual details of FIGS. 2a to 3h are not to be considered to be exclusive to the respective figure in this case. Rather, the individual elements, for example connection methods, sealing means or the like, can be freely combined in order to satisfy a required use scenario.

The invention claimed is:

1. An electronic module for a vehicle, comprising:
    a plate formed from a metal material, the plate defining a support element that includes:
        a first side;
        a second side opposite the first side; and
        at least one opening through the support element from the first side to the second side;
    a component support printed circuit board element affixed to the first side of the support element;
    a printed circuit board element affixed to the second side of the support element, such that the support element is between the component support printed circuit board element and the printed circuit board element, the printed circuit board element being at least one of a printed circuit board having an epoxy resin and a flexible printed circuit board;
    a covering element affixed to the first side of the support element so as to encapsulate the component support printed circuit board and the at least one opening in an interior region between the covering element and the support element; and
at least one contact-making element that is conductively connected to the printed circuit board element on the second side of the support element, that passes through the at least one opening and into the interior region, and that is conductively connected to the component support printed circuit board element to provide conductive contact between the component support printed circuit board element and the printed circuit board element;
    wherein the support element has at least one cutout with a sealing element between at least one of:
        the support element and the covering element; and
        the support element and the printed circuit board element.

2. The electronic module as claimed in claim 1, wherein the electronic module is hermetically sealed.

3. The electronic module as claimed in claim 1, wherein a material of the covering element and a material of the support element have a similar coefficient of thermal expansion.

4. The electronic module as claimed in claim 1, wherein at least one of:
the covering element and the support element are connected by a connection from amongst the group consisting of an adhesive connection, a welded connection, an encapsulated connection, and a rivet connection; and
the printed circuit board element and the support element are connected using an adhesive bond.

5. The electronic module as claimed in claim 1, wherein the support element has a further opening outside the covering element that is configured to connect a conductor element or a sensor element to the printed circuit board element.

6. The electronic module as claimed in claim 1, wherein the support element and the printed circuit board element each have a respective closable hole in a region inside the covering element.

7. The electronic module as claimed in claim 1, wherein a molded encapsulation is disposed on the support element in a region outside the covering element.

8. A control unit for a vehicle, comprising:
an electronic module that includes:
a plate formed from a metal material, the plate defining a support element that has:
a first side;
a second side opposite the first side; and
at least one opening through the support element from the first side to the second side;
a component support printed circuit board element affixed to the first side of the support element;
a printed circuit board element affixed to the second side of the support element, such that the support element is between the component support printed circuit board element and the printed circuit board element, the printed circuit board element being at least one of a printed circuit board having an epoxy resin and a flexible printed circuit board;
a covering element affixed to the first side of the support element so as to encapsulate the component support printed circuit board and the at least one opening in an interior region between the covering element and the support element; and
at least one contact-making element that is conductively connected to the printed circuit board element on the second side of the support element, that passes through the at least one opening and into the interior region, and that is conductively connected to the component support printed circuit board element to provide conductive contact between the component support printed circuit board element and the printed circuit board element;
wherein the support element and the printed circuit board element each have a respective closable hole in a region inside the covering element.

9. A vehicle, having at least one of:
(i) an electronic module that includes:
a plate formed from a metal material, the plate defining a support element that has:
a first side;
a second side opposite the first side; and
at least one opening through the support element from the first side to the second side;
a component support printed circuit board element affixed to the first side of the support element;
a printed circuit board element affixed to the second side of the support element, such that the support element is between the component support printed circuit board element and the printed circuit board element, the printed circuit board element being at least one of a printed circuit board having an epoxy resin and a flexible printed circuit board;
a covering element affixed to the first side of the support element so as to encapsulate the component support printed circuit board and the at least one opening in an interior region between the covering element and the support element; and
at least one contact-making element that is conductively connected to the printed circuit board element on the second side of the support element, that passes through the at least one opening and into the interior region, and that is conductively connected to the component support printed circuit board element to provide conductive contact between the component support printed circuit board element and the printed circuit board element;
wherein the support element and the printed circuit board element each have a respective closable hole in a region inside the covering element; and
(ii) a control unit that includes the electronic module.

10. An electronic module for a vehicle, having:
a covering element;
a component support printed circuit board element;
a support element having a first side and a second side;
a printed circuit board element; and
at least one contact-making element configured to provide conductive contact between the component support printed circuit board element and the printed circuit board element;
wherein the covering element and the component support printed circuit board element are positioned on the first side of the support element;
wherein the printed circuit board element is positioned on the second side of the support element;
wherein the support element has at least one opening;
wherein the contact-making element is routed through the opening; and
wherein the support element and the printed circuit board element each have a respective closable hole in a region inside the covering element.

11. The electronic module as claimed in claim 10, wherein the electronic module is hermetically sealed.

12. The electronic module as claimed in claim 10, wherein a material of the covering element and a material of the support element have a similar coefficient of thermal expansion.

13. The electronic module as claimed in claim 10, wherein at least one of:
the covering element and the support element are connected by a connection from amongst the group consisting of an adhesive connection, a welded connection, an encapsulated connection, and a rivet connection; and
the printed circuit board element and the support element are connected using an adhesive bond.

14. The electronic module as claimed in claim 10, wherein the support element has a further opening outside the covering element that is configured to connect a conductor element or a sensor element to the printed circuit board element.

15. The electronic module as claimed in claim 10, wherein the support element has at least one cutout with a sealing element between at least one of:
the support element and the covering element; and
the support element and the printed circuit board element.

16. The electronic module as claimed in claim 10, wherein a molded encapsulation is disposed on the support element in a region outside the covering element.

17. An electronic module for a vehicle, comprising:
- a plate formed from a metal material, the plate defining a support element that includes:
  - a first side;
  - a second side opposite the first side; and
  - at least one opening through the support element from the first side to the second side;
- a component support printed circuit board element affixed to the first side of the support element;
- a printed circuit board element affixed to the second side of the support element, such that the support element is between the component support printed circuit board element and the printed circuit board element, the printed circuit board element being at least one of a printed circuit board having an epoxy resin and a flexible printed circuit board;
- a covering element formed from a further metal material, and directly welded to the metal material on the first side of the support element so as to encapsulate the component support printed circuit board and the at least one opening in an interior region between the covering element and the support element; and
- at least one contact-making element that is conductively connected to the printed circuit board element on the second side of the support element, that passes through the at least one opening and into the interior region, and that is conductively connected to the component support printed circuit board element to provide conductive contact between the component support printed circuit board element and the printed circuit board element.

* * * * *